United States Patent
Cho et al.

(10) Patent No.: US 9,343,564 B2
(45) Date of Patent: May 17, 2016

(54) SEMICONDUCTOR DEVICE INCLUDING A GATE ELECTRODE ON A PROTRUDING GROUP III-V MATERIAL LAYER AND METHOD OF MANUFACTURING THE SEMICONDUCTOR DEVICE

(71) Applicants: Young-jin Cho, Yongin-si (KR); Kyoung-yeon Kim, Seoul (KR); Sang-moon Lee, Yongin-si (KR); Ki-ha Hong, Cheonan-si (KR); Eui-chul Hwang, State College, PA (US)

(72) Inventors: Young-jin Cho, Yongin-si (KR); Kyoung-yeon Kim, Seoul (KR); Sang-moon Lee, Yongin-si (KR); Ki-ha Hong, Cheonan-si (KR); Eui-chul Hwang, State College, PA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/718,968

(22) Filed: May 21, 2015

(65) Prior Publication Data
US 2015/0255592 A1 Sep. 10, 2015

Related U.S. Application Data

(63) Continuation of application No. 13/611,127, filed on Sep. 12, 2012, now Pat. No. 9,070,706.

(30) Foreign Application Priority Data

Nov. 15, 2011 (KR) .......................... 10-2011-0119125

(51) Int. Cl.
*H01L 29/06* (2006.01)
*H01L 29/778* (2006.01)
*H01L 29/66* (2006.01)
(Continued)

(52) U.S. Cl.
CPC ...... *H01L 29/7787* (2013.01); *H01L 21/02538* (2013.01); *H01L 29/122* (2013.01); *H01L 29/20* (2013.01); *H01L 29/66431* (2013.01); *H01L 29/66462* (2013.01); *H01L 29/66795* (2013.01);
(Continued)

(58) Field of Classification Search
CPC ............................ H01L 21/335; H01L 29/775
USPC ............................................. 257/24; 438/285
See application file for complete search history.

(56) References Cited

U.S. PATENT DOCUMENTS 5,401,357 A * 3/1995 Okuhira et al. ............... 438/694
5,859,447 A * 1/1999 Yang et al. ..................... 257/197
(Continued)

FOREIGN PATENT DOCUMENTS

KR 10-2010-0129146 A 12/2010
KR 10-2011-0013257 A 2/2011
KR 10-2011-0078507 A 7/2011

*Primary Examiner* — Caleb Henry
(74) *Attorney, Agent, or Firm* — Harness, Dickey & Pierce, P.L.C.

(57) ABSTRACT

A semiconductor device including a group III-V barrier and a method of manufacturing the semiconductor device, the semiconductor device including: a substrate, insulation layers formed to be spaced apart on the substrate, a group III-V material layer for filling the space between the insulation layers and having a portion protruding higher than the insulation layers, a barrier layer for covering the side and upper surfaces of the protruding portion of the group III-V material layer and having a bandgap larger than that of the group III-V material layer, a gate insulation film for covering the surface of the barrier layer, a gate electrode formed on the gate insulation film, and source and drain electrodes formed apart from the gate electrode. The overall composition of the group III-V material layer is uniform. The barrier layer may include a group III-V material for forming a quantum well.

7 Claims, 5 Drawing Sheets

(51) Int. Cl.
  *H01L 29/20* (2006.01)
  *H01L 29/78* (2006.01)
  *H01L 21/02* (2006.01)
  *H01L 29/12* (2006.01)

(52) U.S. Cl.
  CPC .......... *H01L 29/7783* (2013.01); *H01L 29/785* (2013.01)

(56) References Cited

U.S. PATENT DOCUMENTS

| | | | |
|---|---|---|---|
| 6,413,802 B1 * | 7/2002 | Hu et al. | 438/151 |
| 6,475,869 B1 * | 11/2002 | Yu | 438/303 |
| 6,525,403 B2 * | 2/2003 | Inaba et al. | 257/618 |
| 6,657,252 B2 * | 12/2003 | Fried et al. | 257/316 |
| 6,767,793 B2 * | 7/2004 | Clark et al. | 438/286 |
| 7,176,092 B2 * | 2/2007 | Yeo et al. | 438/283 |
| 7,323,710 B2 * | 1/2008 | Kim et al. | 257/19 |
| 7,384,838 B2 * | 6/2008 | Hsu et al. | 438/230 |
| 7,777,250 B2 * | 8/2010 | Lochtefeld | 257/190 |
| 7,799,592 B2 * | 9/2010 | Lochtefeld | 438/44 |
| 8,253,211 B2 * | 8/2012 | Cheng et al. | 257/431 |
| 8,274,097 B2 * | 9/2012 | Cheng | 257/190 |
| 8,324,660 B2 * | 12/2012 | Lochtefeld et al. | 257/190 |
| 8,329,541 B2 * | 12/2012 | Ye et al. | 438/285 |
| 8,362,561 B2 * | 1/2013 | Nuttinck et al. | 257/351 |
| 8,497,177 B1 * | 7/2013 | Chang et al. | 438/283 |
| 8,502,263 B2 * | 8/2013 | Li et al. | 257/103 |
| 8,502,351 B2 * | 8/2013 | Shah et al. | 257/618 |
| 8,519,436 B2 * | 8/2013 | Lochtefeld et al. | 257/190 |
| 8,524,547 B2 * | 9/2013 | Nowak | 438/157 |
| 2003/0151077 A1 * | 8/2003 | Mathew et al. | 257/250 |
| 2008/0073667 A1 * | 3/2008 | Lochtefeld | 257/190 |
| 2010/0219480 A1 * | 9/2010 | Tezuka et al. | 257/369 |
| 2010/0252862 A1 * | 10/2010 | Ko et al. | 257/192 |
| 2010/0289116 A1 * | 11/2010 | Lin et al. | 257/510 |
| 2010/0301390 A1 * | 12/2010 | Ko et al. | 257/190 |
| 2010/0301391 A1 * | 12/2010 | Lochtefeld | 257/190 |
| 2011/0049568 A1 * | 3/2011 | Lochtefeld et al. | 257/190 |
| 2011/0147795 A1 * | 6/2011 | Rachmady et al. | 257/192 |
| 2011/0156004 A1 * | 6/2011 | Radosavljevic et al. | 257/24 |
| 2011/0210374 A1 * | 9/2011 | Lochtefeld | 257/190 |
| 2011/0223735 A1 * | 9/2011 | Yu et al. | 438/299 |
| 2011/0298050 A1 * | 12/2011 | Luo et al. | 257/347 |
| 2012/0208331 A1 * | 8/2012 | Kikkawa | 438/172 |
| 2012/0231596 A1 * | 9/2012 | Majhi et al. | 438/285 |
| 2012/0235210 A1 * | 9/2012 | Takemae et al. | 257/194 |
| 2012/0292665 A1 * | 11/2012 | Marino et al. | 257/194 |
| 2012/0305987 A1 * | 12/2012 | Hirler et al. | 257/192 |
| 2012/0319211 A1 * | 12/2012 | van Dal et al. | 257/401 |
| 2013/0026539 A1 * | 1/2013 | Tang et al. | 257/192 |
| 2013/0034943 A1 * | 2/2013 | Lochtefeld | 438/172 |
| 2013/0049068 A1 * | 2/2013 | Lin et al. | 257/192 |
| 2013/0105869 A1 * | 5/2013 | Lee et al. | 257/288 |
| 2013/0105946 A1 * | 5/2013 | Lee et al. | 257/615 |

* cited by examiner

SEMICONDUCTOR DEVICE INCLUDING A GATE ELECTRODE ON A PROTRUDING GROUP III-V MATERIAL LAYER AND METHOD OF MANUFACTURING THE SEMICONDUCTOR DEVICE

CROSS-REFERENCE TO RELATED APPLICATIONS

This application is a continuation of U.S. application Ser. No. 13/611,127 filed on Sep. 12, 2012 and claims the benefit of Korean Patent Application No. 10-2011-0119125, filed on Nov. 15, 2011, in the Korean Intellectual Property Office, the disclosure of which is incorporated herein in its entirety by reference.

BACKGROUND

1. Field

The present disclosure relates to semiconductor devices, and more particularly, to semiconductor devices including a group III-V barrier and methods of manufacturing the semiconductor devices.

2. Description of the Related Art

As semiconductor devices have become increasingly more highly integrated, it is increasingly more difficult to maintain or improve the performance of transistors due to reduction of the physical lengths of their gates.

Thus, research is being conducted on technology involved in improving the performance of transistors by constructing them using a strained silicon (Si) channel or by constructing transistors using materials including a high k oxide or a metal gate.

However, if the gate lengths of transistors are shorter than about 10 nm, it becomes necessary to change the channel material or to change the structure of the semiconductor device from a conventional planar bulk type to a fully depleted silicon-on-insulator (FD-SOI) type, for example, or a fin field effect transistor (FINFET) structure.

In particular, a group III-V semiconductor material, in which effective mass of electrons is small and injection velocity is fast in a low electric field has been proposed for use as a channel material for making low-power and high-speed transistors.

SUMMARY

At least some example embodiments provide semiconductor devices including a group III-V barrier and methods of manufacturing such semiconductor devices.

Additional aspects will be set forth in part in the description which follows and, in part, will be apparent from the description, or may be learned by practice of the presented embodiments.

According to one or more example embodiments, a semiconductor device may include: a substrate, at least two insulation layer portions spaced apart on the substrate, a group III-V material layer for filling the space between the insulation layer portions including a portion protruding higher than the insulation layer, a barrier layer covering the side and upper surfaces of the protruding portion of the group III-V material layer and having a bandgap larger than that of the group III-V material layer, a gate insulation film covering the surface of the barrier layer, a gate electrode on the gate insulation film; and source and drain electrodes disposed apart from the gate electrode, wherein the overall composition of the group III-V material layer is uniform.

In some example embodiments, the barrier layer may include a group III-V material forming a quantum well.

In some example embodiments, the source and drain electrodes may contact the barrier layer and the gate insulation film.

In some example embodiments, the group III-V material layer may be a compound semiconductor layer including at least one group III element and at least one group V element. The barrier layer may be a compound semiconductor layer including at least one group III element and at least one group V element. The at least one group III element may be at least one selected from the group consisting of indium (In), gallium (Ga), and aluminum (Al). The at least one group V element may be at least one selected from the group consisting of arsenic (As), phosphorus (P), and antimony (Sb).

In some example embodiments, the thickness of the barrier layer may be less than 1.5 nm.

In some example embodiments, the barrier layer includes the same group III element as the group II-V material layer and the group V element in the barrier layer is the same as the group V layer in the group III-V material layer.

In some example embodiments, the at least two insulation layer portions are selectively etchable.

In some example embodiments, the protruding portion of the group III-V material layer is defect-free.

In some example embodiments, a first of the at least two insulation layers and a second of the at least two insulation layers are comprised of different materials.

In some example embodiments, the different materials of the insulation layers are selected from an oxide and a nitride.

In some example embodiments, the group III-V material layer is a compound semiconductor layer including at least one group III element and at least one group V element.

In some example embodiments, the at least one III element is selected from the group consisting of indium, (In), gallium (Ga), and aluminum (Al).

In some example embodiments, the at least one V element is selected from the group consisting of arsenic (As), phosphorus (P), and antimony (Sb).

According to example embodiments, a method of manufacturing a semiconductor device may include: forming a base insulation layer on a substrate, exposing a portion of the substrate, forming a group III-V material layer on the substrate, where the group III-V material layer may have a portion that protrudes above the base insulation layer, forming a barrier layer on the group III-V material layer, the barrier layer covering the side and upper surfaces of the protruding portion of the group III-V material layer and having a bandgap larger than that of the group III-V material layer, forming a gate insulation film on the barrier layer, forming a gate electrode on the gate insulation film; and forming source and drain electrodes spaced apart from the gate electrode on the group III-V material layer, wherein the overall composition of the group III-V material layer is uniform.

In some example embodiments, forming of the insulation layer may include: forming on the substrate a first insulation layer for exposing the portion of the substrate; and forming a second insulation layer on the first insulation layer.

In some example embodiments, the forming of the group III-V material layer having the portion that protrudes above the insulation layer may include: growing laterally the group III-V material layer on the exposed portion of the substrate and extending the group III-V material layer onto the insulation layer, planarizing the group III-V material layer until the top surface of the group III-V material layer is even with the top surface of the insulation layer, and removing a portion of the insulation layer to expose the protruding portion of the planarized group III-V material layer.

In some example embodiments, the forming of the group III-V material layer having the portion that protrudes above the insulation layer may include: growing laterally the group III-V material layer on the exposed portion of the substrate and extending the group III-V material layer onto the second insulation layer; performing planarization on the group III-V material layer until the second insulation layer is exposed; and removing the second insulation layer around the flattened group III-V material layer.

In some example embodiments, the barrier layer may include a group III-V material for forming a quantum well.

In some example embodiments, the source and drain electrodes may be formed to contact the barrier layer and the gate insulation film.

The group III-V material layer and the barrier layer may be formed by using an epitaxy method.

The group III-V material layer and the barrier layer may be continuous with one another.

In some example embodiments, the barrier layer is less than 1.5 nm thick. In some example embodiments, the group III-V material layer is a compound semiconductor layer including at least one group III element ant at least one group V element, and the barrier layer is made from the same group III element and the same group V element as the group III-V material layer.

In some example embodiments, the forming of the base insulation layer may include forming on the substrate a first insulation layer for exposing a portion of the substrate and forming a second insulation layer on the first insulation layer. In some example embodiments, the forming the group III-V material layer having the portion that protrudes above the insulation layer may include growing laterally the group III-V material layer on the exposed portion of the substrate and extending the group III-V material layer on the second insulation layer, planarizing the group III-V material layer until the second insulation layer is exposed and removing the second insulation layer adjacent to the planarized group III-V material layer. In some example embodiments, the composition of the first insulation layer is different than the composition of the second insulation layer.

The semiconductor device according to the present invention includes a group III-V compound semiconductor material as a channel material, the group III-V compound semiconductor material having a small effective mass of electrons and fast injection velocity in a low electric field. The side and upper surfaces of a channel layer formed of the channel material are covered with a barrier layer having a bandgap larger than that of the channel material. Thus, dispersion of carriers may be prevented when carriers move in a channel, and thus, it is possible to move carriers at low power and high speed.

In addition, since the side and upper surfaces of the channel layer which contact a gate electrode are covered with the barrier layer having a large bandgap, the trap density at the interface of the channel layer is small compared to the case when the barrier layer does not exist or when the barrier layer partially exists. Thus, the degradation of characteristics of the semiconductor device which may occur when a voltage lower than a threshold voltage (sub-threshold swing) is applied thereto may be decreased.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
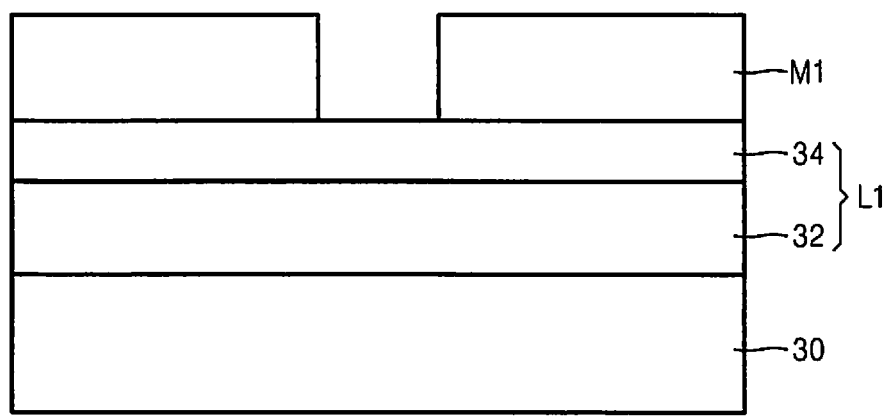
FIGS. 1 through 6 are cross-sectional views for describing a method of manufacturing a semiconductor device, according to example embodiments of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The present invention now will be described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element; there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIGS. 1 through 6 are cross-sectional views for describing a method of manufacturing a semiconductor device including a group III-V barrier, according to example embodiments of the present invention.

Figure 2:
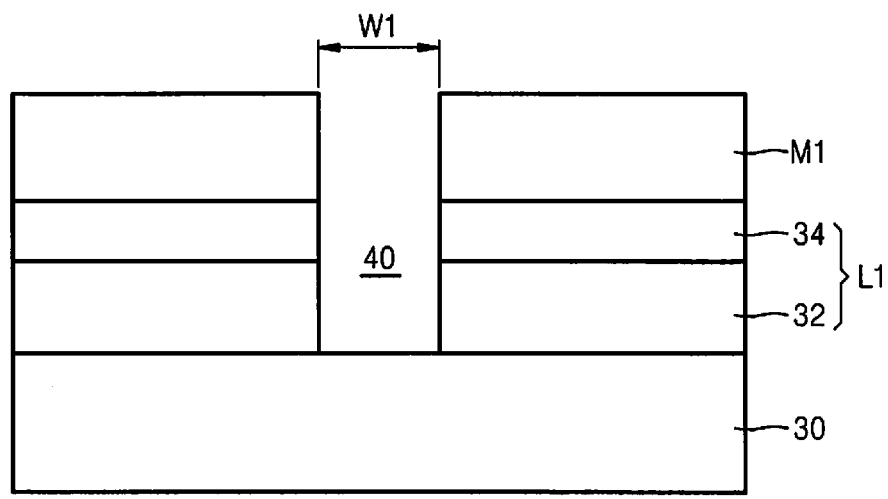

Referring to FIG. 1, an insulation layer L1 is formed on a substrate 30. The substrate 30 may be, for example, a silicon (Si) substrate. The insulation layer L1 may be formed by sequentially depositing first and second insulation layers 32 and 34. The first insulation layer 32 may be a nitride layer and may be formed of, for example, silicon nitride (SiN). In addition, the first insulation layer 32 may be formed of oxide, for example, silicon oxide (SiO2). The second insulation layer 34 may be a nitride layer or an oxide layer. The first insulation layer 32 and the second insulation layer 34 may be formed of materials different from each other. For example, when the first insulation layer 32 is formed of nitride, the second insulation layer 34 may be formed of oxide. On the contrary, when the first insulation layer 32 is formed of oxide, the second insulation layer 34 may be formed of nitride. A photosensitive film pattern M1 for exposing a portion of the second insulation layer 34 is formed on the insulation layer L1. The exposed portion of the second insulation layer 34 is etched by using the photosensitive film pattern M1 as an etch mask. The etching may be performed by using an anisotropic dry etching method. The etching may be performed until the substrate 30 is exposed. By this etching, a hole 40 is formed in the insulation layer L1 as illustrated in FIG. 2. The insulation layer L1 may be divided into two parts by the hole 40. The width W1 of the hole 40 may be smaller than 30 nm, for example, smaller than 10 nm. The hole 40 is formed in a direction perpendicular to the surface of the substrate 30. The photosensitive film pattern M1 is removed after the etching.

Figure 3:
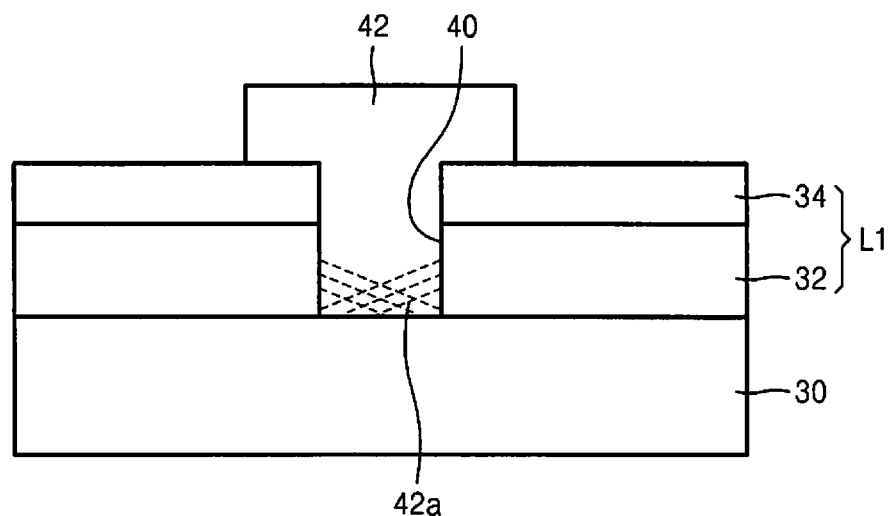
Figure 4:
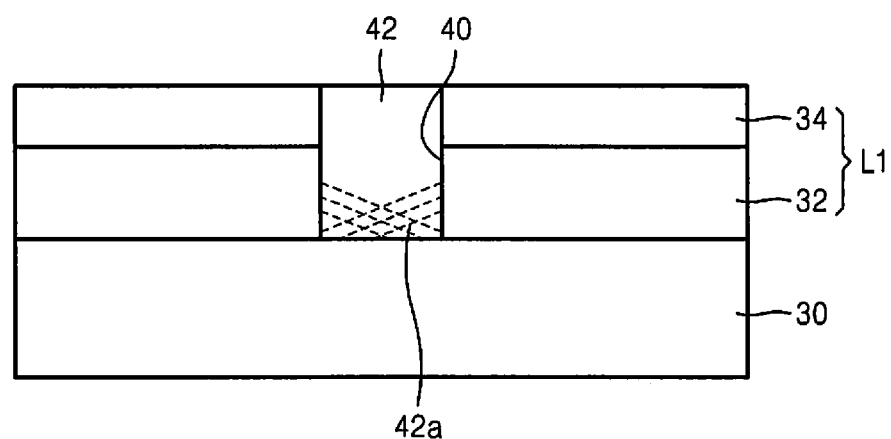

Referring to FIG. 3, a first material layer 42 filling the hole 40 is formed on the second insulation layer 34. The first material layer 42 may be formed using an epitaxial growth method. The first material layer 42 may be formed so that the lateral growth thereof is faster than the vertical growth thereof. Thus, a portion of the first material layer 42 formed on the second insulation layer 34 is formed to have a width wider than a thickness thereof. When the first material layer 42 is grown in the hole 40, a defect 42a may be generated at the interface between the substrate 30 and the first material layer 42. This defect 42a may be grown together with the first material layer 42 in the hole 40, but the defect 42a is located mostly in an area surrounded by the first insulation layer 32, inside the hole 40, because the lateral growth is faster than the vertical growth. Thus, a portion of the first material layer 42 formed above the second insulation layer 32, which may be used as a channel region, does not include a defect. After forming the first material layer 42 in this manner, planarization is performed on the first material layer 42 by grinding or by polishing. This planarization may be performed via a chemical and mechanical polishing (CMP) method until a top surface of the first material layer 42 is approximately even with a top surface of second insulation layer 34. As a result, as illustrated in FIG. 4, the first material layer 42 remains substantially only in the hole 40. The first material layer 42 may be formed of a group III-V compound and the overall composition of the first material layer 42 may be uniform. The group III-V compound may be a binary, ternary, or quaternary compound including at least one group III element and at least one group V element. For example, the group III-V compound may be a compound including at least one group III element selected from the group consisting of indium (In), gallium (Ga), and aluminum (Al) and at least one group V element selected from the group consisting of arsenic (As), phosphorus (P), and antimony (Sb). In this case, the binary compound may be, for example, InP, GaAs, InAs, InSb, or GaSb. The ternary compound may be, for example, InGaP, InGaAs, AlInAs, InGaSb, GaAsSb, or GaAsP. Since the first material layer 42 is a group III-V compound and the portion that is used as a channel region does not include a defect, it is possible to move carriers at low power and high speed.

Figure 5:
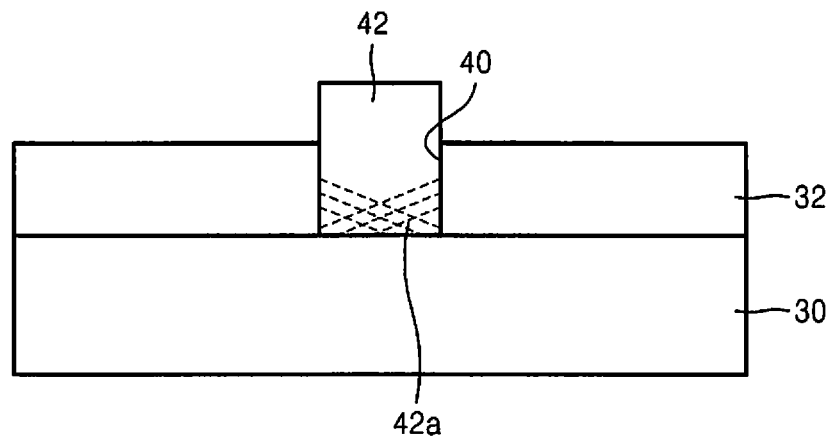

Referring to FIGS. 4 and 5, the second insulation layer 34 is removed after the planarization. The second insulation layer 34 may be removed by using a selective etching method. For example, the second insulation layer 34 may be removed by using a wet etchant exhibiting etching selectivity to the second insulation layer 34 and the first material layer 42. As illustrated in FIG. 5, a portion of the first material layer 42, surrounded by the second insulation layer 34, exposed after the second insulation layer 34 is removed, and thus, the first material layer 42 has a form in which the upper portion thereof protrudes above the first insulation layer 32. The protruding portion of the first material layer 42 may be used as a channel.

Figure 6:
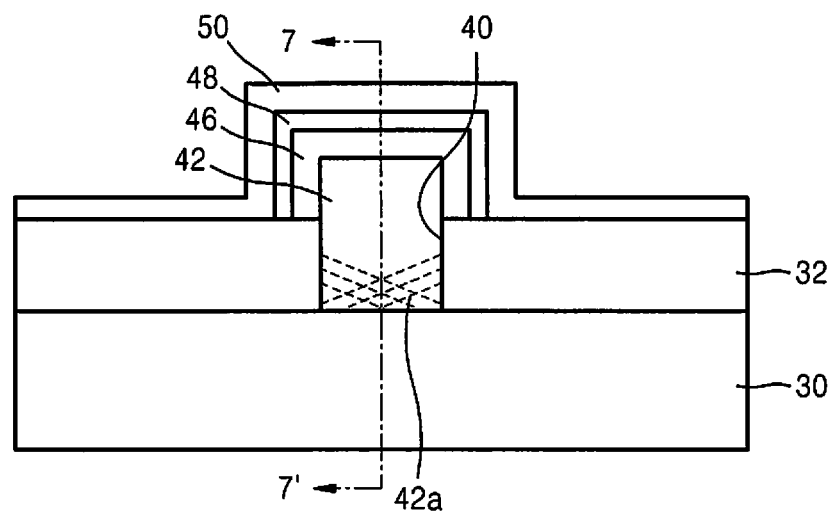

Referring to FIG. 6, a barrier layer 46 covering the side and upper surfaces of the protruding portion of the first material layer 42 is formed. The barrier layer 46 may be formed to have a thickness less than 5 nm. For example, the barrier layer 46 may be formed to have a thickness less than 3 nm or a thickness between about 0.5 nm and about 1 nm. The barrier layer 46 may be formed of a material having a bandgap larger than that of the first material layer 42. A quantum well is formed around the first material layer 42 due to the existence of the barrier layer 46 having a large bandgap, and thus, the dispersion of carriers may be prevented during channel carrier movement through the first material layer 42, and a channel may be clearly defined.

In addition, the side and upper surfaces of the first material layer 42, that is used as a channel layer, face a gate electrode that is formed in the following exemplary processes. Since the side and upper surfaces of the first material 42 are covered with the barrier layer 46 having a large bandgap, the trap density at the interface of the channel layer is small compared to the case when the barrier layer 46 does not exist or when the barrier layer 46 partially exists on the side or upper surface of the first material layer 42. Thus, the degradation of the characteristics of the semiconductor device, which may occur when a voltage lower than a threshold voltage (sub-threshold swing) is applied, may be decreased.

The barrier layer 46 may be formed by using an epitaxy method. Thus, the first material layer 42 may be continuous with the barrier layer 46 and each may be formed by using an epitaxial growth method. The barrier layer 46 may be formed of a group III-V compound. The group III-V compound that is used for forming the barrier layer 46 may be the same as a compound that is used in the first material layer 42 under the condition where the above bandgap relation between the barrier layer 46 and the first material layer 42 is satisfied.

Next, a gate insulation film 48 covering the side and upper surfaces of the barrier layer 46 is formed. The gate insulation film 48 may be formed of a dielectric having a high dielectric constant. For example, the gate insulation film 48 may be formed of oxide and/or a nitride, each of which has a high dielectric constant, the oxide may be Al2O3, HfO2, ZrO2, La2O3, Gd2O3, or Sc2O3, and the nitride may be AlN or SiNx.

After forming the gate insulation film 48, a gate electrode 50 is formed on the first insulation layer 32, for example, with the gate electrode covering the upper and side surfaces of the gate insulation film 48.

Figure 7:
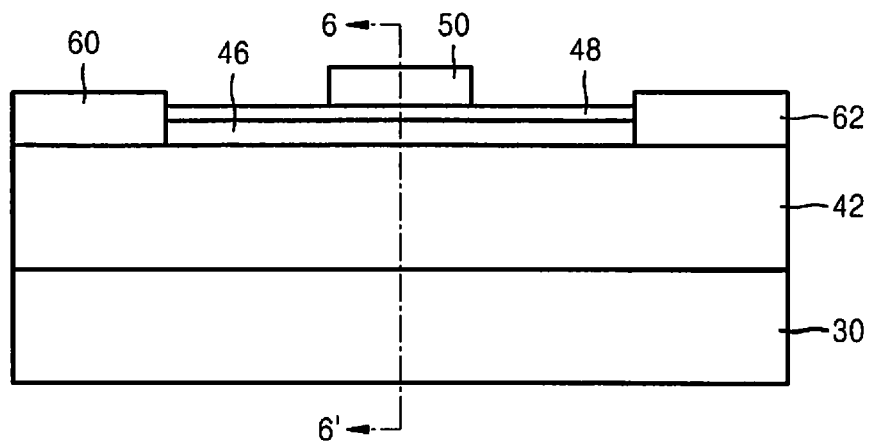
FIG. 7 is a cross-sectional view taken along a line 7-7' of the device illustrated in FIG. 6.

Next, referring to FIG. 7 illustrating a cross-sectional view taken along the line 7-7' of FIG. 6, a source electrode 60 and a drain electrode 62 are formed apart from each other on the first material layer 42. The barrier layer 46 and the gate insulation film 48 are formed on the first material layer 42 between the source electrode 60 and the drain electrode 62. The barrier layer 46 and the gate insulation film 48 may be formed to contact the source and drain electrodes 60 and 62. The source and drain electrodes 60 and 62 may be formed before or after forming the barrier layer 46 and the gate insulation film 48. FIG. 6 is a diagram illustrating a cross-section view taken along the line 6-6' of FIG. 7.

Figure 8:
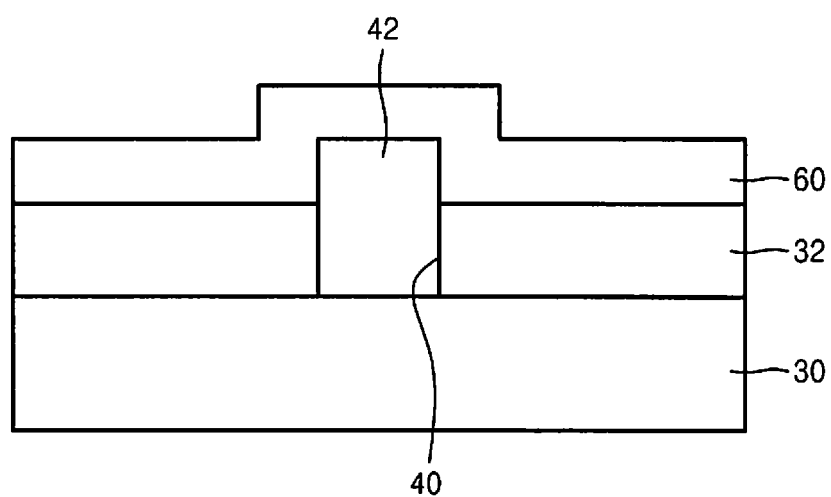
FIG. 8 is a left side view of the device illustrated in FIG. 7.

Referring to FIG. 8, the source electrode 60 is formed to cover a protruding portion of the first material layer 42, that is, to cover the side and upper surfaces of the protruding portion.

Figure 9:
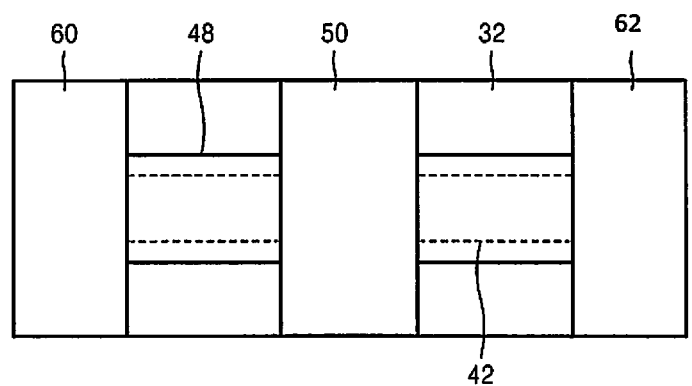
FIG. 9 is a plan view of the device illustrated in FIG. 7.

Referring to FIG. 9, the source electrode 60, the gate electrode 50, and the drain electrode 62 are disposed apart from each other and in some embodiments, are disposed parallel to each other, and may be disposed perpendicular to the first material layer 42.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A semiconductor device comprising:
    a substrate;
    a group III-V material layer comprising a defect-free portion and a portion including defect;
    a barrier layer connected to the defect-free portion;
    a gate insulation film on the barrier layer;
    a gate electrode on the gate insulation film; and
    source and drain electrodes disposed apart from the gate electrode,
    wherein the barrier layer is not connected to the portion including the defect of the group III-V material layer; and
    wherein an overall composition of the group III-V material layer is substantially uniform.

2. The semiconductor device of claim 1, wherein the barrier layer comprises a group III-V material forming a quantum well.

3. The semiconductor device of claim 1, wherein the source and drain electrodes contact the barrier layer and the gate insulation film.

4. The semiconductor device of claim 1, wherein the defect-free portion comprises a protruded portion.

5. The semiconductor device of claim 1, wherein the barrier layer is a compound semiconductor layer including at least one group III element and at least one group V element.

6. The semiconductor device of claim 1, the portion including defect is surrounded by an insulating layer.

7. The semiconductor device of claim 1, the barrier layer has a bandgap larger than that of the group III-V material layer.

* * * * *